United States Patent
Razeghi

(10) Patent No.: US 11,600,496 B2
(45) Date of Patent: Mar. 7, 2023

(54) IN-SITU P-TYPE ACTIVATION OF III-NITRIDE FILMS GROWN VIA METAL ORGANIC CHEMICAL VAPOR DEPOSITION

(71) Applicant: Northwestern University, Evanston, IL (US)

(72) Inventor: Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 89 days.

(21) Appl. No.: 16/951,376

(22) Filed: Nov. 18, 2020

(65) Prior Publication Data

US 2021/0151329 A1    May 20, 2021

Related U.S. Application Data

(60) Provisional application No. 62/937,314, filed on Nov. 19, 2019.

(51) Int. Cl.
H01L 21/00   (2006.01)
H01L 21/324  (2006.01)
H01L 21/02   (2006.01)

(52) U.S. Cl.
CPC ...... *H01L 21/3245* (2013.01); *H01L 21/0254* (2013.01); *H01L 21/0262* (2013.01); *H01L 21/02579* (2013.01)

(58) Field of Classification Search
CPC ........... H01L 21/3245; H01L 21/02576; H01L 21/0254; H01L 21/02579
See application file for complete search history.

(56) References Cited

U.S. PATENT DOCUMENTS

| 5,306,662 A | 4/1994 | Nakamura et al. |
| 5,657,335 A | 8/1997 | Rubin et al. |
| 5,926,726 A | 7/1999 | Bour et al. |
| 6,218,280 B1 * | 4/2001 | Kryliouk ............... H01L 33/007 438/46 |

(Continued)

FOREIGN PATENT DOCUMENTS

WO   WO 2019/094391 A2   5/2019

OTHER PUBLICATIONS

Mike Cooke, "Activating buried p-type GaN for power electronics," www.semiconductor—Today.com; *Compounds & Advanced Silicon*, vol. 13, Issue 8, Oct. 2018, pp. 70-71. https: doi.org/10.1063/1.5041879.

(Continued)

*Primary Examiner* — Reema Patel
(74) *Attorney, Agent, or Firm* — Bell & Manning, LLC

(57) ABSTRACT

Methods for activating a p-type dopant in a group III-Nitride semiconductor are provided. In embodiments, such a method comprises annealing, in situ, a film of a group III-Nitride semiconductor comprising a p-type dopant formed via metalorganic chemical vapor deposition (MOCVD) at a first temperature for a first period of time under an atmosphere comprising $NH_3$ and $N_2$; and cooling, in situ, the film of the group III-Nitride semiconductor to a second temperature that is lower than the first temperature under an atmosphere comprising $N_2$ in the absence of $NH_3$, to form an activated p-type group III-Nitride semiconductor film.

20 Claims, 2 Drawing Sheets

(56) References Cited

U.S. PATENT DOCUMENTS

2002/0157596 A1 10/2002 Stockman et al.
2007/0026658 A1 2/2007 Lee et al.

OTHER PUBLICATIONS

Wenshen Li et al., "Activation of buried p-GaN in MOCVD-regrown vertical structures," *Applied Physics Letters*, vol. 113, (2018), 062105-1 to 062105-05.
Nicholas LaCroce et al., "Effect of Dopant Activation on Device Characteristics of InGaN-based Light Emitting Diodes," Abstract submitted for the Mar. 15 Meeting of the American Physical Society, Date submitted: Nov. 14, 2014, p. 1.
Herbert Paul Maruska et al., "A modern perspective on the history of semiconductor nitride blue light sources," *Solid-State Electronics*, vol. 111, (2015), pp. 32-41.
Liu Shuang-Tao et al., "The residual C concentration control for low temperature growth p-type GaN," *Chinese Physics B*, 2017, vol. 26, No. 10: 107102, pp. 1-8.

\* cited by examiner

IN-SITU P-TYPE ACTIVATION OF III-NITRIDE FILMS GROWN VIA METAL ORGANIC CHEMICAL VAPOR DEPOSITION

CROSS-REFERENCE TO RELATED APPLICATIONS

The present application claims the priority benefit of U.S. Provisional Patent App. No. 62/937,314 filed on Nov. 19, 2019, the entire disclosure of which is incorporated by reference herein.

REFERENCE TO GOVERNMENT RIGHTS

This invention was made with government support under W911NF-19-C-0025 awarded by the Defense Advanced Projects Agency. The government has certain rights in the invention.

BACKGROUND

Metal organic chemical vapor deposition (MOCVD)-grown p-type III-Nitride thin films come out of the MOCVD growth system highly resistive and need to be subjected to an additional annealing step in order to activate the magnesium dopant and realize low resistivity p-type thin films. Magnesium-hydrogen bonds can be broken with the addition of energy to the lattice, and at sufficient temperature the small hydrogen atoms can diffuse out of the top of the layer. This process is termed magnesium activation. The first developed solution to p-type activation was to use Low-Energy Electron Beam Irradiation (LEEBI). However, this technique is not well suited to scaling for manufacturability. It was eventually discovered that magnesium activation could be achieved by annealing the wafer at a high temperature. However, the annealing temperatures necessary are very high, which can lead to thermal decomposition of the wafer. This led to the adoption of rapid thermal annealing (RTA) as a production technique to realize p-type magnesium activation. In this conventional process, the wafer is removed from the MOCVD growth system and loaded into a special infrared furnace capable of reaching 1000° C. in less than 10 seconds, and cooling back below the decomposition temperature just as fast. However, this ex situ step results in an additional complication in the realization of III-Nitride devices.

SUMMARY

Methods for activating a p-type dopant in a group III-Nitride semiconductor film grown via MOCVD are provided. The activation is carried out in the same chamber as the growth of the III-nitride films and is thus, in situ. Activation in situ eliminates the RTA processing step. Eliminating RTA annealing eliminates the need for a separate RTA system as well as the need to move wafers to that system, resulting in increased production cycle times and reduced production costs.

In embodiments, a method for activating a p-type dopant in a group III-Nitride semiconductor, comprises annealing, in situ, a film of a group III-Nitride semiconductor comprising a p-type dopant formed via metalorganic chemical vapor deposition (MOCVD) at a first temperature for a first period of time under an atmosphere comprising $NH_3$ and $N_2$; and cooling, in situ, the film of the group III-Nitride semiconductor to a second temperature that is lower than the first temperature under an atmosphere comprising $N_2$ in the absence of $NH_3$, to form an activated p-type group III-Nitride semiconductor film.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

DETAILED DESCRIPTION

Figure 1:
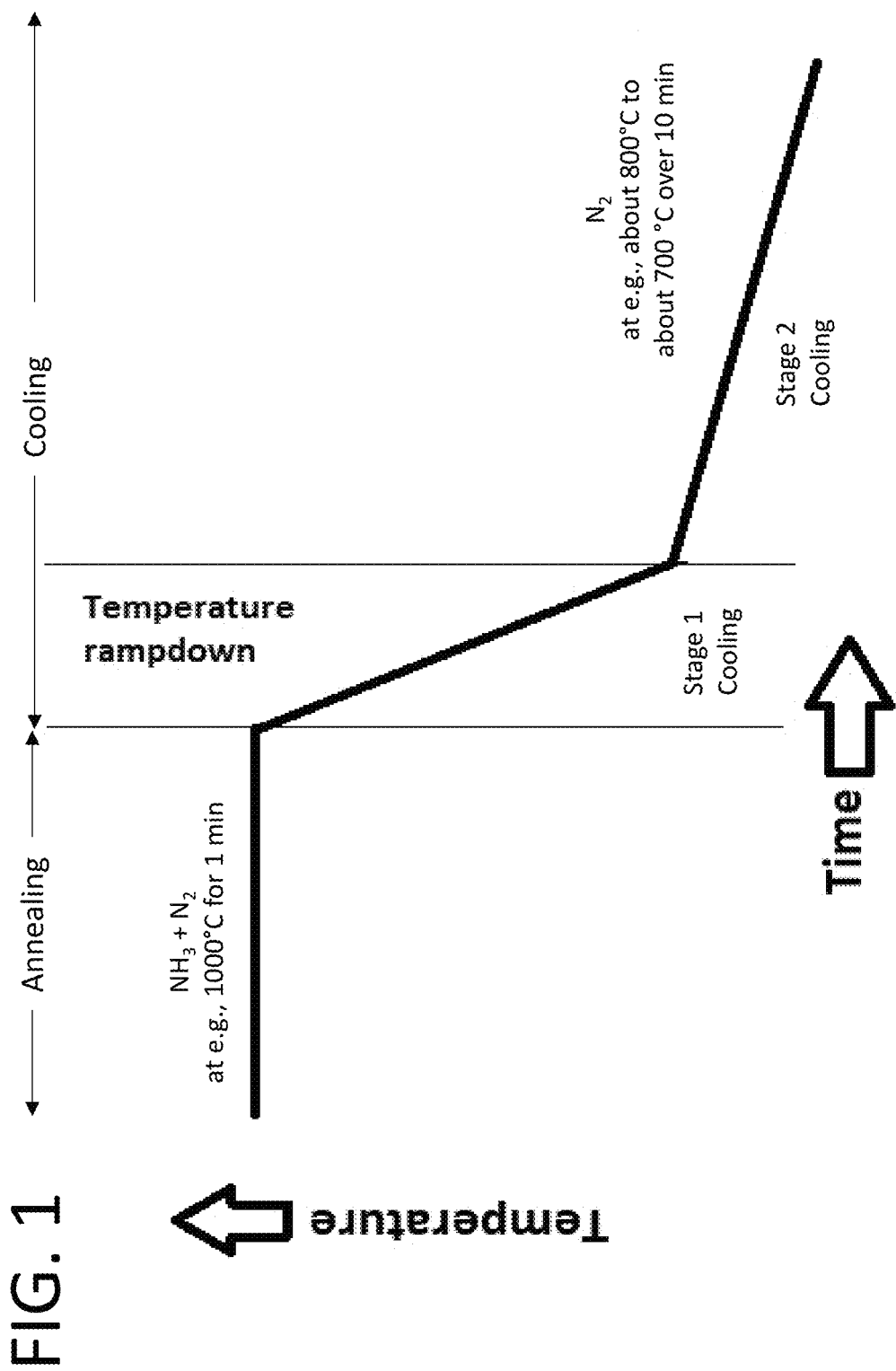
FIG. 1. is a schematic of an illustrative two-step activation process.

Methods for activating a p-type dopant in a group III-Nitride semiconductor film grown via MOCVD are provided. In an embodiment, such a method comprises annealing, in situ, a film of a group III-Nitride semiconductor comprising a p-type dopant formed via metalorganic chemical vapor deposition (MOCVD) at a first temperature for a first period of time under an atmosphere comprising $NH_3$ and $N_2$; and cooling, in situ, the film of the group III-Nitride semiconductor to a second temperature that is lower than the first temperature under an atmosphere comprising $N_2$ in the absence of $NH_3$. The method results in an activated, p-type group III-Nitride semiconductor film. The method may further comprise forming the film of the group III-Nitride semiconductor on a substrate via MOCVD.

Any reactor system suitable for carrying out MOCVD may be used to carry out the methods. The film of the group III-Nitride semiconductor may be formed by exposing the substrate to a vapor composition comprising a group III precursor comprising a group III element; a nitrogen precursor comprising nitrogen; and a dopant precursor comprising a p-type dopant. The exposure takes place under conditions sufficient to form a compound semiconductor from the group III and nitrogen precursors via MOCVD and to dope that compound semiconductor with the p-type dopant.

The group III precursors are metalorganic compounds comprising a group III element. In embodiments, the group III element is selected from Ga, Al, and In. A variety of group III precursors may be used, e.g., trimethylgallium, trimethylaluminum, trimethylindium, triethylgallium, triethylaluminum, triethylindium, triisopropylgallium, triisopropylaluminum, triisopropylindium, triisobutylgallium, and triisobutylaluminum. In embodiments, a single group III precursor is used, e.g., a gallium-containing group III precursor to provide a GaN compound semiconductor. In embodiments, more than one group III precursor is used so as to facilitate alloying of the group III elements in the formation of the compound semiconductor. By of illustration, a gallium-containing group III precursor, an aluminum-containing group III precursor and an indium-containing group III precursor may be used to provide a GaAlInN semiconductor. In such a compound semiconductor, the ratios of Ga, Al, In may vary, depending upon the desired properties and application for the semiconductor. Other examples include AlGaN, and InGaN, in which the ratios of the group III may vary.

The nitrogen precursors are compounds comprising nitrogen. Ammonia ($NH_3$) is an illustrative nitrogen precursor.

The dopant precursors are compounds comprising a p-type dopant. Illustrative p-type dopants include Zn, Cd, Be, Mg, Ca, and Ba. In embodiments, the p-type dopant is magnesium (Mg). Bis(cyclopentadienyl)magnesium(II) (MgCp$_2$) is an illustrative dopant precursor to provide Mg. The vapor composition may further comprise a carrier gas (e.g., N$_2$, Ar, H$_2$). Using Mg dopant as an example, as the group III-Nitride semiconductor is grown, the magnesium atom tends to be passivated with a hydrogen bonded to it. This hydrogen is intrinsic to the organometallic source and is also present in ammonia used as the nitrogen precursor. Thus, even if N$_2$ or another inert gas is used as the carrier gas in lieu of hydrogen, group III-Nitride semiconductors that are p-type doped with magnesium are natively highly resistive and require activation as described further below.

By "conditions" as that term is used with respect to the formation of the group III-Nitride semiconductor, refers conditions such as the growth temperature and the pressure of the vapor composition. Illustrative growth temperatures include those in the range of from about 400° C. to about 1000° C., including from about 600° C. to about 1000° C., and from about 700° C. to about 1000° C. Illustrative pressures include those in the range of from about 10 mbar to about 200 mbar, including from about 50 mbar to about 150 mbar. A variety of substrates may be used in the present methods, e.g., sapphire (a-sapphire, m-sapphire, c-sapphire), Al$_2$O$_3$, silicon (Si(111), Si(100)), native β-Ga$_2$O$_3$, MgO, ZnO, etc.

After formation of the p-type group III-Nitride film, the present methods further comprise annealing, in situ, the film at a first temperature for a first period of time under an atmosphere comprising NH$_3$ and N$_2$. The phrase "in situ" means that the grown film is not removed from the reactor system prior to annealing, including not breaking vacuum in the reactor system prior to annealing. The temperature at which annealing is carried out (i.e., the first temperature) may be the same or different (i.e., higher or lower) than the growth temperature. In embodiments, the temperature is in a range of from 900° C. to 1100° C., from 950° C. to 1050° C., or 1000° C. The temperature is held constant during annealing. The period of time over which annealing is carried out (i.e., the first period of time) may be less than 5 minutes, less than 2 minutes, in a range of from 30 seconds to 5 minutes, or 1 minute. The atmosphere comprises both NH$_3$ and N$_2$. The atmosphere generally does not comprise any other components, e.g., the atmosphere is free of H$_2$. In embodiments, the atmosphere consists of NH$_3$ and N$_2$.

After annealing the p-type group III-Nitride film, the present methods further comprising cooling, in situ, the film to a second temperature that is lower than the first temperature under an atmosphere comprising N$_2$ in the absence of NH$_3$, i.e., the atmosphere is free of NH$_3$. The atmosphere generally does not comprise any other components, e.g., the atmosphere is free of Hz. In embodiments, the atmosphere consists of N$_2$. The second temperature may be in a range from 750° C. to 650° C., from 725° C. to 675° C., or 700° C.

The cooling step may take place in multiple stages. A first cooling stage may involve a rapid cool down from the temperature at which annealing is carried out (i.e., the first temperature) to an intermediate temperature that is lower than the first temperature and greater than the second temperature. The intermediate temperature may be in a range of from 840° C. to 780° C., from 820° C. to 790° C., or 800° C. The first cooling stage may take place over a relatively short period of time, e.g., less than 1 minute, less than 30 seconds, less than 15 seconds, or in a range from 10 second to 30 seconds. The NH$_3$ flow from the annealing step may be slowed during the first cooling stage or completely stopped prior to the first cooling stage. A second cooling stage may involve a slower cool down from the intermediate temperature to the second temperature. The second cooling stage may take place over a relatively longer period of time, e.g., in a range of from 5 minutes to 15 minutes, from 7 minutes to 13 minutes, or 10 minutes. The atmosphere in the second cooling stage comprises comprise N$_2$ but does not comprise NH$_3$. In embodiments, the atmosphere in the second cooling stage consists of N$_2$. A third cooling stage may be used involving cooling down from the second temperature to an even lower temperature, e.g., room temperature, prior to removal of the p-type group III-Nitride film (now activated) from the reactor system.

Figure 2:
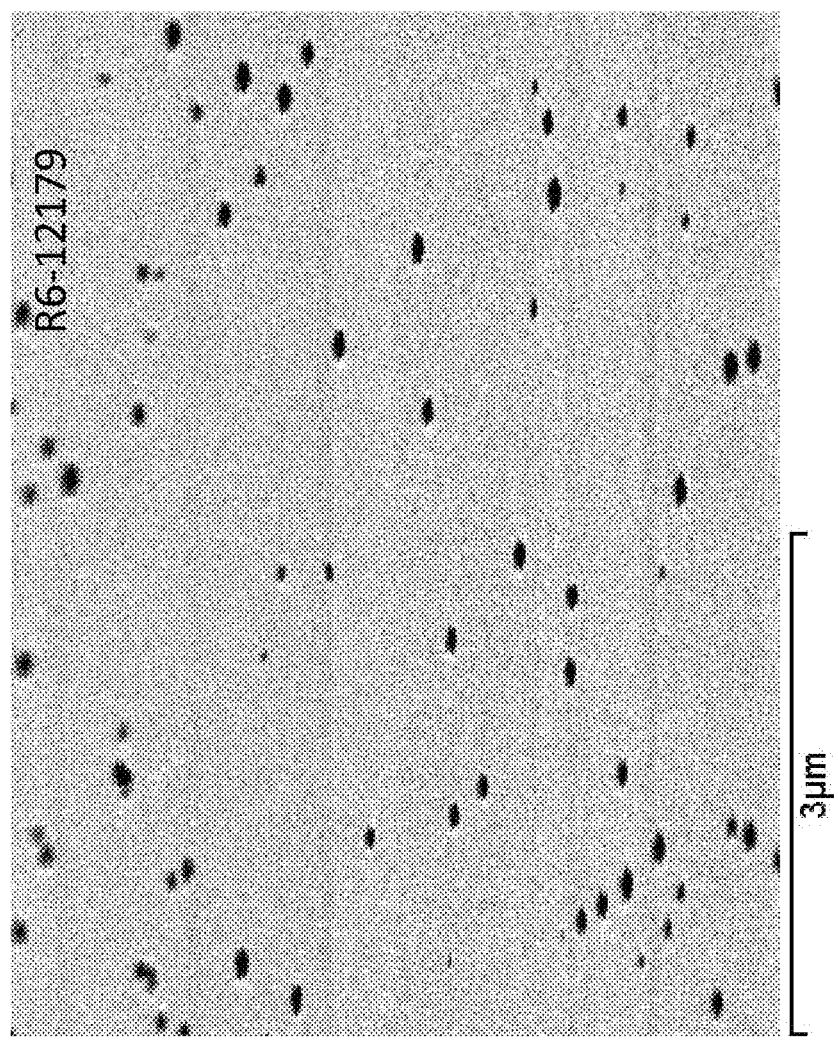
FIG. 2. shows an image of a surface of p-GaN which has been activated according to an illustrative embodiment.

An illustrative two-step activation process (annealing and cooling) is shown in FIG. 1. After formation of the film of group III-Nitride semiconductor comprising the p-type dopant (not shown), the film is annealed, in situ, at a first temperature (e.g., 1000° C.) for a first period of time (e.g., 1 minute) under an atmosphere comprising NH$_3$ and N$_2$. Next, the film is cooled, in situ, to a second temperature (e.g., 700° C.) under an atmosphere comprising N$_2$ in the absence of NH$_3$. In this embodiment, the cooling takes place in two stages, a first rapid cool down to an intermediate temperature (e.g., 800° C.) followed by a slower cool down to the second temperature over a second period of time (e.g., 10 minutes). An image of a surface of an activated p-GaN film is shown in FIG. 2. In this image, holes are seen. However, as thoroughly demonstrated in the Examples, optimization of the activation process resulted in highly conductive p-type group III-Nitride films having no more holes than in non-activated films.

The activated p-type group III-Nitride films are also encompassed by the present disclosure. They may be characterized by their carrier concentrations. In embodiments, the activated p-type group III-Nitride film has a carrier concentration of at least $10^{18}$ cm$^{-3}$, at least $10^{19}$ cm$^{-3}$, or in the range of from $10^{18}$ cm$^{-3}$ to $10^{20}$ cm$^{-3}$. Known techniques may be used to measure carrier concentrations. Devices incorporating the activated p-type group III-Nitride films are also encompassed. Illustrative devices include films for solid-state lighting, high-speed GaNFETs, green and blue InGaN laser diodes, blue laser didoes for optical storage, AlGaN-based photodetectors and focal plane arrays, solar-blind AlGaN-based avalanche photodetectors, and other major group III-nitride applications.

EXAMPLE

Group III-Nitride films were grown via MOCVD in an Aixtron MOCVD system and activated, in situ. Identical layers of p-GaN/p-AlGaN/i-AlGaN/AlN were grown. Tables 1 and 2 summarize the activation conditions examined and the properties of the resulting films. The results show that the properties of the films are highly sensitive to the activation conditions. Activation in a single step did not produce optimal results. Some activation conditions resulted in hexagonal holes on the surface of the films as shown in FIG. 2. This may be attributed to surface decomposition. Superior results were obtained by heating the MOCVD-grown films on a wafer at a high temperature (e.g., ~1000° C.) under ammonia and nitrogen (N$_2$) for, e.g., up to 1 minute. Then, the MOCVD reactor is rapidly cooled down and the ammonia flow is stopped. The wafer is held at an intermediate temperature, e.g., about 800° C. (between 840° C. and 780° C.) under a purely nitrogen (N$_2$) ambient for a prescribed length of time (e.g., a few minutes). The wafer is then cooled down and removed from the MOCVD system. Without any additional annealing the p-type III-nitride films are found to be p-type, highly conductive, and have pristine surfaces with performance similar to the best layers processed with a conventional RTA process.

TABLE 1

In-situ Activation Conditions and Resulting Properties.

| Sample number | Activation condition | | Resistivity (ohm · cm) | Carrier concentration ($cm^3$) | Type | Surface |
|---|---|---|---|---|---|---|
| | | | | Hall measurement | | |
| 12170 | 880° C. (OP40) 10 min $N_2$ + 0.5 slm $NH_3$ | | 7.4 | 5E+17 | n | Good |
| 12178 | 880° C. (OP40) 10 min $N_2$ | | 2.7 | 1E+18 | p or n | Lot of holes |
| 12179 | 850° C. (OP38) 5 min $N_2$ | | 23.6 | 8E+15 | n | Lot of holes |
| 12180 | 880° C. (OP40) 10 min $N_2$ + 0.1 slm $NH_3$ | | 20.6 | 6E+17 | p or n | Good |
| 12181 | 1 min under $N_2$ + $NH_3$ (2.5 slm) 1000° C. (OP49) | 10 min under $N_2$ 800° C. (OP34) 10 min (840 to 780° C.) | 1.2 | 2E+18 | p | Good |
| 12183 | 1 min under $N_2$ + $NH_3$ (2.5 slm) 1000° C. (OP49) | 10 min under $N_2$ 800° C. (OP34) 10 min (820 to 780° C.) | 3.5 | 7E+17 | p | Good |

TABLE 2

In-situ Activation Conditions and Resulting Properties.

| Sample number | Annealing condition | | Resistivity (ohm · cm) | Carrier concentration ($cm^3$) | Type |
|---|---|---|---|---|---|
| | | | | Hall measurement | |
| R6-12165 | 1000° C. 1 min $N_2$ + $NH_3$ | | 9.1 | 1.50E+17 | n-type |
| R6-12166 | 1000° C. 1 min $N_2$ | | 1.2 | 5.00E+18 | n-type |
| R6-12167 | Close 900° C. $N_2$ 1 min | | 1.8 | 7.50E+17 | p-type |
| R6-12168 | 800° C. 15 min $N_2$ | | 4.1 | 2.00E+17 | n-type |
| R6-12169 | Close 850° C. $N_2$ 10 min | | 1.5 | 2.00E+18 | p-type |
| R6-12170 | 880° C. (OP40) 10 min $N_2$ + 0.5 slm $NH_3$ | | 7.4 | 5.00E+17 | n |
| R6-12178 | 880° C. (OP40) 10 min $N_2$ | | 2.7 | 1.00E+18 | p or n |
| R6-12179 | 850° C. (OP38) 5 min $N_2$ | | 23.6 | 8.00E+15 | n |
| R6-12180 | 880° C. (OP40) 10 min $N_2$ + 0.1 slm $NH_3$ | | 20.6 | 6.00E+17 | p or n |
| R6-12181 | 1 min under $N_2$ + $NH_3$ (2.5 slm) 1000° C. (OP49) | 10 min under $N_2$ 800° C. (OP34) 10 min (840 to 780° C.) | 1.2 | 2.00E+18 | p |
| R6-12183 | 1 min under $N_2$ + $NH_3$ (2.5 slm) 1000° C. (OP49) | 10 min under $N_2$ 800° C. (OP34) 10 min (820 to 780° C.) | 3.5 | 6.00E+17 | p |
| R6-12184 | 1 min under $N_2$ + $NH_3$ (2.5 slm) 1000° C. (OP49) | 10 min under $N_2$ 800° C. (OP34) 10 min (840 to 780° C.) | 1.8 | | p |
| R6-12185 | 1 min under $N_2$ + NH3 (2.5 slm) 1000° C. (OP49) | 10 min under $N_2$ 800° C. (OP34) 10 min (840 to 780° C.) | 1.5 | 2.00E+18 | p |
| R6-12186 | 1 min under $N_2$ + $NH_3$ (2.5 slm) 1000° C. (OP49) | 10 min under $N_2$ 800° C. (OP34) 10 min (830 to 780° C.) | 4.1 | 1.00E+18 | p |
| R6-12187 | 10 min under $N_2$ (OP34) 10 min (820 to 780° C.) | | 30 | 1.00E+16 | n |
| R6-12188 | T decrease 900 to 800° C. under $NH_3$ + Mg (peak 940° C.) | 20 min 810° C. under $N_2$ | 30 | 1.00E+17 | p or n |
| R6-12189 | T decrease 900 to 800° C. under $NH_3$ + Mg | 30 min 810° C. under $N_2$ | high | 1.00E+14 | n |
| R6-12191 | 1 min under N2 + $NH_3$ (2.5 slm) 900° C. | 10 min under N2 800° C. (OP34) 10 min (820 to 780° C.) Reference (RTA annealing) | 4.2 | 1.00E+18 | n |
| R6-12165Ann | | RTA 1000° C. 30 s $N_2$ RTA 900° C. 1 min $N_2$ | 0.5 | 2.00E+18 | p-type |

What is claimed is:

1. A method for activating a p-type dopant in a group III-Nitride semiconductor, the method comprising:
   (a) annealing, in situ, a film of a group III-Nitride semiconductor comprising a p-type dopant formed via metalorganic chemical vapor deposition (MOCVD) at a first temperature for a first period of time under an atmosphere consisting of $NH_3$ and $N_2$; and
   (b) cooling, in situ, the film of the group III-Nitride semiconductor to a second temperature that is lower than the first temperature under an atmosphere comprising $N_2$ in the absence of $NH_3$, to form an activated p-type group III-Nitride semiconductor film.

2. The method of claim 1, wherein the group III element is Ga, Al, In, or combinations thereof.

3. The method of claim 1, wherein the p-type dopant is Mg.

4. The method of claim 1, wherein the first temperature is in a range of from 900° C. to 1100° C. and the first period of time is in a range of from 30 seconds to 5 minutes.

5. A method for activating a p-type dopant in a group III-Nitride semiconductor, the method comprising:
   (a) annealing, in situ, a film of a group III-Nitride semiconductor comprising a p-type dopant formed via MOCVD at a first temperature for a first period of time under an atmosphere comprising $NH_3$ and $N_2$; and
   (b) cooling, in situ, the film of the group III-Nitride semiconductor to a second temperature that is lower than the first temperature under an atmosphere comprising $N_2$ in the absence of $NH_3$, to form an activated p-type group III-Nitride semiconductor film,
   wherein step (b) comprises cooling to an intermediate temperature followed by cooling from the intermediate temperature to the second temperature over a second period of time, and
   wherein the intermediate temperature is in a range of from 840° C. to 780° C., the second temperature is in a range of from 750° C. to 650° C., and the second period of time is in a range of from 5 minutes to 15 minutes.

6. The method of claim 1, wherein the second temperature is in a range of from 750° C. to 650° C.

7. The method of claim 1, wherein the atmosphere during step (b) consists of $N_2$.

8. The method of claim 1, wherein step (b) comprises cooling to an intermediate temperature followed by cooling from the intermediate temperature to the second temperature over a second period of time.

9. The method of claim 8, wherein the atmosphere during cooling from the intermediate temperature to the second temperature consists of $N_2$.

10. The method of claim 5, wherein the atmosphere during step (a) is free of $H_2$.

11. A method for activating a Mg dopant in a group III-Nitride semiconductor, the method comprising:
    (a) annealing, in situ, a film of a group III-Nitride semiconductor comprising a Mg dopant formed via MOCVD at a first temperature for a first period of time under an atmosphere consisting of $NH_3$ and $N_2$;
    (b) cooling, in situ, the film of the group III-Nitride semiconductor to an intermediate temperature that is lower than the first temperature; and
    (c) cooling, in situ, the film of the group III-Nitride semiconductor from the intermediate temperature to a second temperature over a second period of time under an atmosphere comprising $N_2$ in the absence of $NH_3$, wherein the second temperature is lower than the first temperature and the intermediate temperature, to form an activated Mg doped III-Nitride semiconductor film.

12. The method of claim 11, wherein the first temperature is in a range of from 900° C. to 1100° C. and the first period of time is in a range of from 30 seconds to 5 minutes.

13. The method of claim 11, wherein the atmosphere during step (c) consists of $N_2$.

14. The method of claim 11, wherein the atmosphere during step (b) and step (c) consists of $N_2$.

15. The method of claim 11, wherein the first temperature is in a range of from 900° C. to 1100° C. and the first period of time is in a range of from 30 seconds to 5 minutes; and
    wherein the intermediate temperature is in a range of from 840° C. to 780° C., the second temperature is in a range of from 750° C. to 650° C., the second period of time is in a range of from 5 minutes to 15 minutes, and the atmosphere during step (c) consists of $N_2$.

16. The method of claim 11, wherein the method consists of steps (a)-(c), followed by cooling, in situ, the film of the group III-Nitride semiconductor from the second temperature to room temperature.

17. A method for activating a Mg dopant in a group III-Nitride semiconductor, the method comprising:
    (a) annealing, in situ, a film of a group III-Nitride semiconductor comprising a Mg dopant formed via MOCVD at a first temperature for a first period of time under an atmosphere comprising $NH_3$ and $N_2$;
    (b) cooling, in situ, the film of the group III-Nitride semiconductor to an intermediate temperature that is lower than the first temperature; and
    (c) cooling, in situ, the film of the group III-Nitride semiconductor from the intermediate temperature to a second temperature over a second period of time under an atmosphere comprising $N_2$ in the absence of $NH_3$, wherein the second temperature is lower than the first temperature and the intermediate temperature, to form an activated Mg doped III-Nitride semiconductor film,
    wherein the intermediate temperature is in a range of from 840° C. to 780° C., the second temperature is in a range of from 750° C. to 650° C., and the second period of time is in a range of from 5 minutes to 15 minutes.

18. A method for activating a p-type dopant in a group III-Nitride semiconductor, the method comprising:
    (a) forming a film of a group III-Nitride semiconductor comprising a p-type dopant formed via metalorganic chemical vapor deposition (MOCVD);

(b) annealing, in situ, after step (a) and prior to step (c), the film of the group III-Nitride semiconductor at a first temperature for a first period of time under an atmosphere comprising $NH_3$ and $N_2$; and (c) cooling, in situ, after step (b), the film of the group III-Nitride semiconductor to a second temperature that is lower than the first temperature under an atmosphere comprising $N_2$ in the absence of $NH_3$, to form an activated p-type group III-Nitride semiconductor film.

19. The method of claim 18, wherein the p-type dopant is Mg and step (c) comprises cooling to an intermediate temperature that is lower than the first temperature followed by cooling from the intermediate temperature to the second temperature over a second period of time.

20. The method of claim 18, wherein the first temperature is in a range of from 900° C. to 1100° C.

* * * * *